United States Patent
Lee et al.

(10) Patent No.: US 11,463,091 B2
(45) Date of Patent: Oct. 4, 2022

(54) ANALOG INPUT DEVICE, COMPUTING SYSTEM AND METHOD FOR RECEIVING AND PROCESSING ANALOG INPUT

(71) Applicant: Razer (Asia-Pacific) Pte. ltd., Singapore (SG)

(72) Inventors: Chung Wei Lee, Singapore (SG); Thuan Teck Tan, Singapore (SG); Wenliang Yang, Singapore (SG); Alvin Sim, Singapore (SG); Kok Kiong Low, Singapore (SG); Ling Duan, Shenzhen (CN); Christopher Mitchell, Singapore (SG)

(73) Assignee: Razer (Asia-Pacific) Pte. Ltd., Singapore (SG)

( * ) Notice: Subject to any disclaimer, the term of this patent is extended or adjusted under 35 U.S.C. 154(b) by 0 days.

(21) Appl. No.: 17/138,728

(22) Filed: Dec. 30, 2020

(65) Prior Publication Data
US 2021/0126634 A1    Apr. 29, 2021

Related U.S. Application Data

(63) Continuation-in-part of application No. PCT/SB2019/050512, filed on Oct. 17, 2019.
(Continued)

(51) Int. Cl.
*H03K 17/969* (2006.01)
*H01H 13/83* (2006.01)
(Continued)

(52) U.S. Cl.
CPC .............. *H03K 17/969* (2013.01); *G01L 1/24* (2013.01); *G06F 3/0202* (2013.01);
(Continued)

(58) Field of Classification Search
CPC .............. H03K 17/969; H03K 17/9627; H03K 17/9629
(Continued)

(56) References Cited

U.S. PATENT DOCUMENTS 4,484,179 A * 11/1984 Kasday ................. G06F 3/0421
                                                      250/221
4,860,008 A * 8/1989 Battarel ............... H03K 17/969
                                                      250/221
(Continued)

FOREIGN PATENT DOCUMENTS

CN       201667666 U    12/2010
CN       102843143 A    12/2012
(Continued)

OTHER PUBLICATIONS

Extended European Search Report dated Jan. 14, 2022 in 11 pages, for the corresponding European Patent Application No. 19896442.1.
(Continued)

*Primary Examiner* — Albert K Wong
(74) *Attorney, Agent, or Firm* — Polsinelli PC

(57) ABSTRACT

An analog input device including at least one mounting panel and a matrix of analog push button assemblies mounted thereon. Each analog push button assembly including an analog pressure sensor including a pressure reception arrangement having an optical sensing sub-arrangement configured to measure an amount of light varied according to a pressure sensed at the pressure reception arrangement and an output terminal for outputting an analog signal corresponding to the amount of light measured, and a plunger element configured to exert the pressure on the pressure reception arrangement. The analog input device may include a multiplexer including an input side coupled to the push button assemblies and an output side; an analog-to-digital converter coupled to the output side of the multi-
(Continued)

plexer; a processor coupled to the analog-to-digital converter and configured to output a data packet; and a communication interface configured to transmit the data packet to a host computing device.

17 Claims, 8 Drawing Sheets

Related U.S. Application Data

(60) Provisional application No. 62/779,006, filed on Dec. 13, 2018.

(51) Int. Cl.
*G01L 1/24* (2006.01)
*G06F 3/02* (2006.01)
*H01H 13/14* (2006.01)

(52) U.S. Cl.
CPC ............ *H01H 13/14* (2013.01); *H01H 13/83* (2013.01); *H01H 2231/002* (2013.01); *H01H 2239/022* (2013.01)

(58) Field of Classification Search
USPC .......................................................... 341/31
See application file for complete search history.

(56) References Cited

U.S. PATENT DOCUMENTS

| | | | | |
|---|---|---|---|---|
| 5,036,191 A * | 7/1991 | Senoo | ................... | H03K 17/969 250/229 |
| 5,266,949 A * | 11/1993 | Rossi | ................... | H03K 17/968 200/314 |
| 5,675,329 A | 10/1997 | Barker et al. | | |
| 6,369,800 B1 * | 4/2002 | Nading | ................. | G06F 3/0202 345/170 |
| 6,525,677 B1 * | 2/2003 | Printzis | ............... | H03K 17/943 345/170 |
| 7,924,175 B2 * | 4/2011 | Gitzinger | .............. | G06F 3/0202 250/221 |
| 8,411,029 B2 | 4/2013 | Casparian et al. | | |
| 8,648,812 B2 | 2/2014 | Aull et al. | | |
| 8,700,829 B2 | 4/2014 | Casparian et al. | | |
| 8,711,011 B2 | 4/2014 | Casparian et al. | | |
| 8,717,202 B1 * | 5/2014 | Bajaj | ..................... | G06F 3/0227 250/227.21 |
| 8,922,399 B2 * | 12/2014 | Bajaj | ..................... | G06F 3/0202 702/41 |
| 9,246,487 B2 | 1/2016 | Casparian et al. | | |
| 9,389,711 B2 | 7/2016 | Casparian et al. | | |
| 9,857,892 B2 | 1/2018 | Armstrong-Muntner | | |
| 9,952,682 B2 | 4/2018 | Zhang et al. | | |
| 2006/0261984 A1 * | 11/2006 | Jung | ..................... | H01H 13/83 341/31 |
| 2013/0291090 A1 | 10/2013 | Toebes et al. | | |
| 2014/0267053 A1 | 9/2014 | Bajaj et al. | | |
| 2015/0061901 A1 | 3/2015 | Casparian et al. | | |
| 2015/0153847 A1 | 6/2015 | Irani et al. | | |
| 2021/0126634 A1 * | 4/2021 | Lee | .......... | G06F 3/023 |

FOREIGN PATENT DOCUMENTS

| | | |
|---|---|---|
| CN | 205049922 U | 2/2016 |
| DE | 102007022358 A1 | 11/2008 |
| JP | 3377114 B2 | 2/2003 |
| KR | 10-2007-0022586 A | 2/2007 |

OTHER PUBLICATIONS

International Search Report and Written Opinion, dated Jan. 22, 2020, for the corresponding International Application No. PCT/SG2019/050512 in 11 pages.

Wooting two—lekker edition (https://wooting.io/wooting_two_lekker) 2019 in 13 pages.

ST, AN979 Application Note; Driving an Analog Keyboard With the ST7 ADC By Microcontroller Division Applications, 2003 STMicroelectronics (https://www.st.com/content/ccc/resource/technical/document/application_note/00/09/79/3a/ac/59/4b/8e/CD00004024.pdf/files/CD00004024.pdf/jcr:content/translations/en.CD00004024.pdf) in 14 pages.

\* cited by examiner

ANALOG INPUT DEVICE, COMPUTING SYSTEM AND METHOD FOR RECEIVING AND PROCESSING ANALOG INPUT

CROSS-REFERENCE TO RELATED APPLICATIONS

The application is a Continuation-In-Part of PCT International Application No. PCT/SG2019/050512, filed Oct. 17, 2019, which claims the benefit of U.S. Provisional Patent Application No. 62/779,006, filed on Dec. 13, 2018; of which the full disclosures of these applications are incorporated herein by reference for all purposes.

TECHNICAL FIELD

Various embodiments generally relate to an analog input device, a computing system for receiving and processing analog input and a method of processing analog input for a computer system. In particular, various embodiments generally relate to a force-sensitive or pressure sensitive analog input device.

BACKGROUND

Conventionally, input devices such as gaming controller, gaming keypad, keyboard, or mice includes buttons or keys which are coupled to digital switches. These digital switches only output binary signal, and limits the achievable functions of the input devices and possible user intents. For example, in gaming, more granularity of the input may be preferred for more precise control of a magnitude for a character's speed, directions, movements, actions etc. Such controls are typically not achievable with binary input devices.

Accordingly, there is a need for a more effective input device to address the above issues.

SUMMARY

According to various embodiments, there is provided an analog input device. The analog input device may include at least one mounting panel. The analog input device may include a matrix of analog push button assemblies mounted to the at least one mounting panel, each analog push button assembly including an analog pressure sensor. The analog pressure sensor of the analog input device may include a pressure reception arrangement having an optical sensing sub-arrangement configured to measure an amount of light varied according to a pressure sensed at the pressure reception arrangement and an output terminal for outputting an analog signal corresponding to the amount of light measured. The analog pressure sensor of the analog input device may include a plunger element configured to exert the pressure on the pressure reception arrangement when the analog push button assembly is pressed by a user's finger. The analog input device may further include a multiplexer including an input side and an output side, wherein the input side is coupled to the output terminals of the matrix of analog push button assemblies. The analog input device may further include an analog-to-digital converter which is coupled to the output side of the multiplexer. The analog input device may further include a processor which is coupled to the analog-to-digital converter and which is configured to output a data packet including a button identity (ID) of the push button assembly pressed by the user's finger and a digital-step-value corresponding to the analog signal from the push button assembly. The analog input device may further include a communication interface configured to transmit the data packet to a host computing device.

According to various embodiments, there is provided a computing system for receiving and processing analog input. The computing system may include a host processor. The computing system may include the input device, as described herein, connected to the host processor via the communication interface. The host processor may be configured to receive the data packet from the input device, to determine an amount of depression of a respective analog push button assembly based on the digital-step-value corresponding to the analog signal from the analog push button assembly, and to generate a corresponding predetermined application event in an application based on the determined amount of depression of the respective analog push button assembly and an input setting for the application.

According to various embodiments, there is provided a method of processing analog input for a computing system as described herein. The method may include generating, via the pressure reception arrangement, the analog signal corresponding to the amount of light measured as a measure of the pressure exerted on the pressure reception arrangement when the push button assembly is pressed by a user's finger. The method may include digitizing, via the analog-to-digital converter, the analog signal into the corresponding digital-step-value. The method may include outputting, via the processor, the data packet including button identity (ID) of the push button assembly pressed by the user's finger and a digital-step-value corresponding to the analog signal from the push button assembly. The method may include transmitting, via the communication interface, the data packet from the processor of the input device to the host processor of the computing system. The method may include determining, via the host processor, the amount of depression of the respective analog push button assembly based on the corresponding digital-step-value from the data packet received. The method may include generating, via the host processor, the corresponding predetermined application event in the application based on the determined amount of depression of the respective analog push button assembly and the input setting for the application.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1:
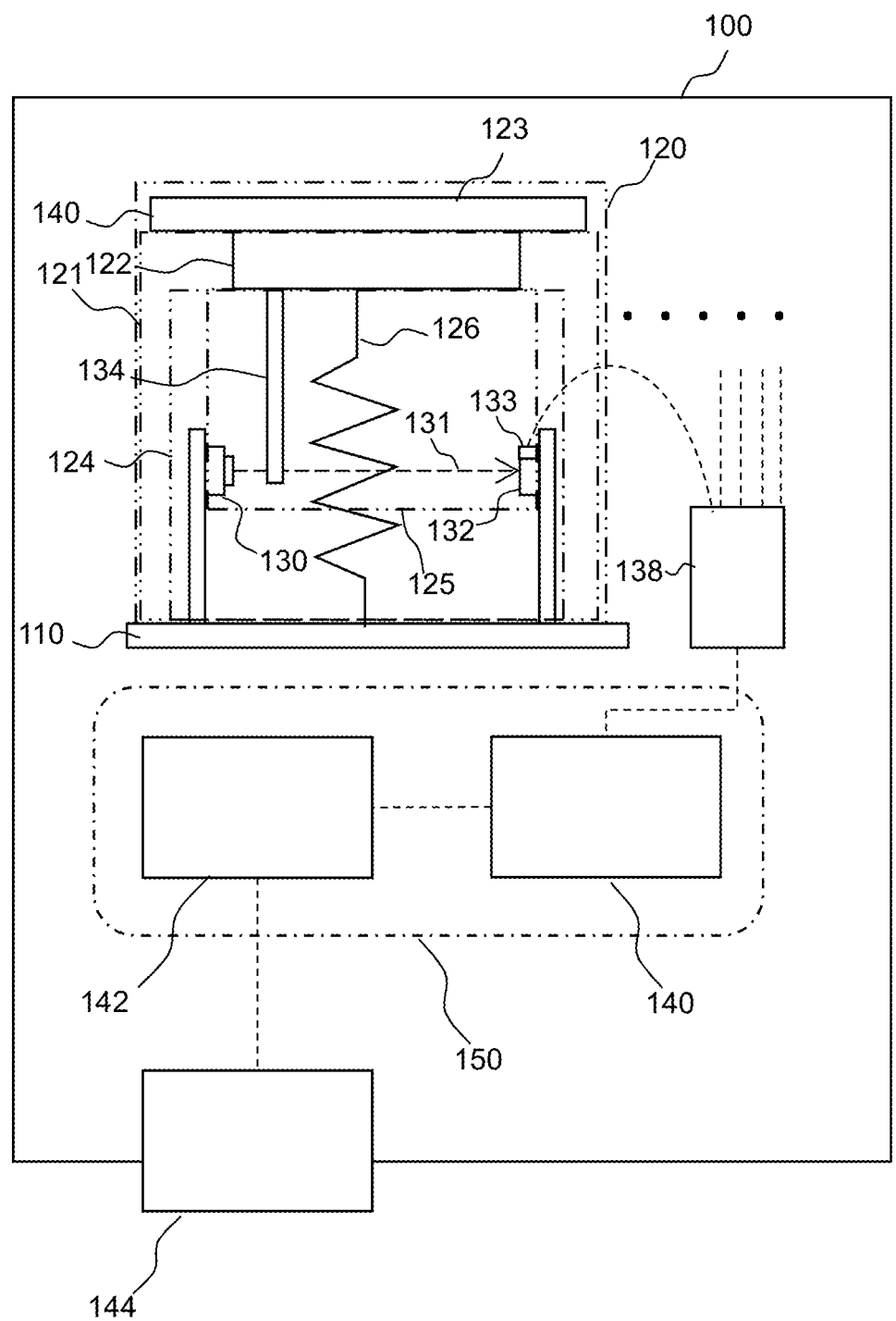
FIG. 1 shows a schematic diagram of an analog input device according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

As described herein, a processor (or a processing unit or a host processing unit or a host processor etc) may be understood as any kind of a logic implementing entity, which may be special purpose circuitry or a processor executing software stored in a memory, firmware, or any combination thereof. Thus, the processor may be a hard-wired logic circuit or a programmable logic circuit such as a programmable processor (e.g. Programmable Logic Controller (PLC)), e.g. a microprocessor (e.g. a Complex Instruction Set Computer (CISC) processor or a Reduced Instruction Set Computer (RISC) processor). The processor may also be a processor executing software, e.g. any kind of computer program, e.g. a computer program using a virtual machine code such as e.g. Java.

Various embodiments generally relate to an analog input device. In particular, various embodiments generally relate to a force-sensitive analog input device or a pressure-sensitive analog input device. According to various embodiments, the input device may include, but not limited to, a controller, a keypad, a keyboard, a mouse, a joystick, or a steering wheel. According to various embodiments, the input device may include a matrix of analog buttons or keys, each may be configured to vary an input signal based on an amount of depressing force or pressure applied by an user on the respective analog button or key. Accordingly, the respective analog button or key may provide a variable force-sensitive or pressure-sensitive analog input depending on the force or pressure applied to the analog button or key. According to various embodiments, varying an amount of depressing force or pressure applied on the respective analog button or key may vary an extent or degree of depression experienced by the analog button or key. Accordingly, varying the extent or degree of depression of the respective analog button or key may vary an analog output signal of the respective analog button or key from the analog input device. According to various embodiments, the analog output signal may be processed by a processor to generate a corresponding application event in an application. According to various embodiments, the analog output signal may be processed and displayed through lighting effects to allow a user to intuitively see the depth and strength of pressing the analog button or key.

Various embodiments generally relate to a computing system for receiving and processing analog input and a method of processing analog input for the computer system. The computing system may refer to an information handling system or a functional system capable of performing substantial computation. The computing system may include a processing unit, random-access memory, disk storage, input and output devices etc. According to various embodiments, the computing system may include a host processor and the analog input device of the various embodiments. According to various embodiments, the user may provide an analog input via the analog input device such that an analog input signal may be sent via the analog input device to the host processor and the host processor may process the analog input signal to generate a corresponding application event in response to the analogy input signal and provide a corresponding output. The corresponding output may include, but not limited to, a text and/or graphic display, sound, lightings, or haptic feedback. For example, output in the form of lightings may be the lighting effect of the analog input device of the various embodiments.

The following examples pertain to various embodiments.

Example 1 is an analog input device including:

at least one mounting panel;

a matrix of analog push button assemblies mounted to the at least one mounting panel, each analog push button assembly including an analog pressure sensor, wherein the analog pressure sensor includes
- a pressure reception arrangement having an optical sensing sub-arrangement configured to measure an amount of light varied according to a pressure sensed at the pressure reception arrangement and an output terminal for outputting an analog signal corresponding to the amount of light measured, and
- a plunger element configured to exert the pressure on the pressure reception arrangement when the analog push button assembly is pressed by a user's finger;

a multiplexer including an input side and an output side, wherein the input side is coupled to the output terminals of the matrix of analog push button assemblies, an analog-to-digital converter which is coupled to the output side of the multiplexer;

a processor which is coupled to the analog-to-digital converter and which is configured to output a data packet including a button identity (ID) of the push button assembly pressed by the user's finger and a digital-step-value corresponding to the analog signal from the push button assembly; and a communication interface configured to transmit the data packet to a host computing device.

In Example 2, the subject matter of Example 1 may optionally include an analog filter coupled in an electrical connection between the pressure sensor and the analog-to-digital converter.

In Example 3, the subject matter of Example 1 or 2 may optionally include that the analog signal is an analog voltage.

In Example 4, the subject matter of any one of Examples 1 to 3 may optionally include that the pressure reception arrangement may include a biasing element which is arranged between the plunger element and the at least one mounting panel and which bias the plunger element away from the at least one mounting panel in a biasing direction.

In Example 5, the subject matter of Example 4 may optionally include that the optical sensing sub-arrangement may include a light emitter which is disposed at an intermediate level between the plunger element and the at least one mounting panel and which is oriented to emit light along a light path perpendicular to the biasing direction of the biasing element;

a light sensor which is disposed in the light path and which is configured to generate the analog signal based on the amount of light sensed by the light sensor for outputting via the output terminal, and a light blocking element which is associated with the plunger element in a manner so as to be movable together with the plunger element along a movement direction parallel to the biasing direction and which is extending towards the mounting panel to intersect the light path between the light emitter and the light sensor, wherein the light blocking element includes a cut-out profile which varies the amount of light passing through the light blocking element as the light blocking element moves transversely across the light path when the plunger element is moved towards the at least one mounting panel.

In Example 6, the subject matter of any one of Examples 1 to 5 may optionally include a lighting arrangement including a plurality of light sources respectively associated with the matrix of analog push button assemblies in a manner so as to individually illuminate each of the matrix of analog push button assemblies, wherein the plurality of light sources may be lit based on the digital-step-value corresponding to the analog signal from the push button assembly pressed by the user's finger such that a number of light sources among the plurality of light sources to be lit may be proportional to the digital-step-value.

In Example 7, the subject matter of Example 6 may optionally include that the processor may be configured to directly control the lighting arrangement to light the plurality of light sources based on the digital-step-value received from the analog-to-digital converter.

In Example 8, the subject matter of Example 6 may optionally include that the processor may be configured to receive, via the communication interface, a lighting signal generated by the host computing device based on the digital-step-value in the data packet received from the analog input device for controlling the lighting arrangement to light the plurality of light sources based on the digital-step-value.

Example 9 is a computing system for receiving and processing analog input, the computing system including a host processor; and the input device according to any one of Examples 1 to 5 connected to the host processor via the communication interface, wherein the host processor is configured to receive the data packet from the input device, to determine an amount of depression of the push button assembly based on the digital-step-value corresponding to the analog signal from the push button assembly, and to generate a corresponding predetermined application event in an application based on the determined amount of depression of the push button assembly and an input setting for the application.

In Example 10, the subject matter of Example 9 may optionally include that the host processor may be further configured to transform the determined amount of depression onto a non-linear scale prior to generating the corresponding predetermined application event.

In Example 11, the subject matter of Example 9 or 10 may optionally include that the corresponding predetermined application event may include a continuous variable action, and wherein the host processor is configured to generate a state of the continuous variable action according to the determined amount of depression.

In Example 12, the subject matter of Example 9 or 10 may optionally include that the corresponding predetermined application event may include a discrete action, and wherein the host processor is configured to generate the discrete action when the determined amount of depression is equal to or greater than a pre-set depression level.

In Example 13, the subject matter of Example 9 or 10 may optionally include that the corresponding predetermined application event may include a first discrete action and a second discrete action, and wherein the host processor is configured to generate the first discrete action when the determined amount of depression is equal to a first pre-set depression level or between the first pre-set depression level and a second pre-set depression level, and to generate the second discrete action when the determined amount of depression is equal to or greater than the second pre-set depression level.

In Example 14, the subject matter of any one of Examples 9 to 13 may optionally include that the host processor may be configured to toggle between a first input setting and a second input setting for the application based on a user input command via a physical modifier key or a virtual modifier key, and wherein a first corresponding predetermined application event associated with the first input setting is different from a second corresponding predetermined application event associated with the second input setting.

In Example 15, the subject matter of any one of Examples 9 to 14 may optionally include that the analog input device may further include a plurality of light sources respectively associated with the matrix of analog push button assemblies in a manner so as to individually illuminate each of the matrix of analog push button assemblies, wherein the plurality of light sources may be lit based on the digital-step-value corresponding to the analog signal from the push button assembly pressed by the user's finger such that a number of light sources among the plurality of light sources to be lit is proportional to the digital-step-value.

In Example 16, the subject matter of Example 15 may optionally include that the host processor may be configured to generate a lighting signal based on the digital-step-value in the data packet received from the analog input device and transmit the lighting signal to the analog input device for controlling the lighting arrangement to light the plurality of light sources based on the digital-step-value.

In Example 17, the subject matter of Example 15 may optionally include that the processor of the analog input device may be configured to directly control the lighting arrangement to light the plurality of light sources based on the digital-step-value received from the analog-to-digital converter.

Example 18 is a method of processing analog input for a computing system comprising a host processor and an analog input device connected to the host processor, wherein the analog input device comprises: at least one mounting panel; a matrix of analog push button assemblies mounted to the at least one mounting panel; a multiplexer including an input side and an output side, wherein the input side is coupled to the matrix of analog push button assemblies; an analog-to-digital converter which is coupled to the output side of the multiplexer; a processor which is coupled to the analog-to-digital converter; and a communication interface connecting the processor of the analog input device to the host processor, the method including:

generating, via an optical sensing sub-arrangement of a pressure reception arrangement of an analog pressure sensor of one of the matrix of analog push button assemblies, an analog signal, corresponding to an amount of light measured as a measure of a pressure exerted on the pressure reception arrangement by a plunger element of the analog pressure sensor of the one of the matrix of analog push button assemblies when the one of the matrix of analog push button assemblies is pressed by a user's finger, based on measuring an amount of light varied according to the pressure sensed at the pressure reception arrangement;

digitizing, via the analog-to-digital converter, the analog signal into a corresponding digital-step-value;

outputting, via the processor, the data packet including button identity (ID) and the corresponding digital-step-value of the one of the matrix of analog push button assemblies pressed by the user's finger;

transmitting, via the communication interface, the data packet from the processor of the input device to the host processor of the computing system;

determining, via the host processor, the amount of depression of the one of the matrix of analog push button assemblies based on the corresponding digital-step-value from the data packet received; and generating, via the host processor, the corresponding predetermined application event in the application based on the determined amount of depression of the one of the matrix of analog push button assemblies and an input setting for the application.

In Example 19, the subject matter of Example 18 may optionally include transforming the determined amount of depression onto a non-linear scale prior to generating the corresponding predetermined application event.

In Example 20, the subject matter of Example 18 or 19 may optionally include that the corresponding predetermined application event may include a continuous variable action, and wherein generating the corresponding predetermined event may include generating a state of the continuous variable action according to the determined amount of depression.

In Example 21, the subject matter of Example 18 or 19 may optionally include that the corresponding predetermined application event may include a discrete action, and wherein generating the corresponding predetermined event may include generating the discrete action when the determined amount of depression is equal to or greater than a pre-set depression level.

In Example 22, the subject matter of Example 18 or 19 may optionally include that the corresponding predetermined application event may include a first discrete action and a second discrete action, and wherein generating the corresponding predetermined event may include generating the first discrete action when the determined amount of depression is equal to a first pre-set depression level or between the first pre-set depression level and a second pre-set depression level, and to generate the second discrete action when the determined amount of depression is equal to or greater than the second pre-set depression level.

In Example 23, the subject matter of any one of Examples 18 to 22 may optionally include toggling between a first input setting and a second input setting for the application based on a user input command via a physical modifier key or a virtual modifier key, and wherein a first corresponding predetermined application event associated with the first input setting is different from a second corresponding predetermined application event associated with the second input setting.

In Example 24, the subject matter of any one of Examples 18 to 23 may optionally include controlling a plurality of light sources of a lighting arrangement of the analog input device associated with the matrix of analog push button assemblies of the analog input device based on the corresponding digital-step-value in a manner such that a number of light sources among the plurality of light sources of the lighting arrangement being lit is proportional to the corresponding digital-step-value, wherein the plurality of light sources of the lighting arrangement are individually illuminable.

In Example 25, the subject matter of Example 24 may optionally include generating, via the host processor, a lighting signal based the corresponding digital-step-value from the data packet received from the analog input device and sending the lighting signal to the analog input device for controlling the lighting arrangement to light the plurality of light sources based on the corresponding digital-step-value.

In Example 26, the subject matter of Example 24 may optionally include controlling, via the processor of the analog input device, the lighting arrangement to light the plurality of light sources based on the corresponding digital-step-value received from the analog-to-digital converter of the analog input device.

Example 27 is an analog input device including:

at least one mounting panel;

a matrix of analog push button assemblies mounted to the at least one mounting panel;

a multiplexer including an input side and an output side, wherein the input side is coupled to the matrix of analog push button assemblies;

an analog-to-digital converter which is coupled to the output side of the multiplexer to convert an analog signal, from at least one of the matrix of analog push button assemblies as a measure of an amount of depression of the at least one of the matrix of analog push button assemblies when the at least one of the matrix of analog push button assemblies is pressed by a user's finger, into a corresponding digital-step-value;

a lighting arrangement including a plurality of light sources respectively associated with the matrix of analog push button assemblies in a manner so as to individually illuminate each of the matrix of analog push button assemblies; and a processor which is coupled to the analog-to-digital converter and which is configured to control the lighting arrangement to light the plurality of light sources based on the digital-step-value such that a number of light sources among the plurality of light sources to be lit is proportional to the corresponding digital-step-value.

In Example 28, the subject matter of Example 27 may optionally include that the processor may be configured to control the lighting arrangement to light the plurality of light sources based on the digital-step-value received from the analog-to-digital converter.

In Example 29, the subject matter of Example 27 may optionally include a communication interface configured to transmit a data packet to a host computing device, wherein the processor is configured to output the data packet including a button identity (ID) of the at least one of the matrix of analog push button assemblies pressed by the user's finger and the corresponding digital-step-value, and transmit the data packet via the communication interface to the host computing device, wherein the processor is configured to receive, via the communication interface, a lighting signal generated by the host computing device based on the digital-step-value in the data packet received from the analog input device for controlling the lighting arrangement to light the plurality of light sources based on the digital-step-value.

In Example 30, the subject matter of any one of Examples 27 to 29 may optionally include an analog filter coupled in an electrical connection between the matrix of analog push button assemblies and the analog-to-digital converter.

In Example 31, the subject matter of any one of Examples 27 to 30 may optionally include that the analog signal is an analog voltage.

Example 32 is a method of controlling a lighting arrangement of an analog input device, the method including:

generating an analog signal, from at least one of a matrix of analog push button assemblies of an analog input device when the at least one of the matrix of analog push button assemblies is pressed by a user's finger;

digitizing, via an analog-to-digital converter of the analog input device coupled to an output side of a multiplexer having the matrix of analog push button assemblies coupled to an input side of the multiplexer, the analog signal into a corresponding digital-step-value; and controlling a plurality of light sources of a lighting arrangement of the analog input device associated with the matrix of analog push button assemblies of the analog input device based on the corresponding digital-step-value in a manner such that a number of light sources among the plurality of light sources of the lighting arrangement being lit is proportional to the corresponding digital-step-value, wherein the plurality of light sources of the lighting arrangement are individually illuminable.

In Example 32, the subject matter of Example 31 may optionally include controlling, via a processor of the analog input device, the lighting arrangement to light the plurality of light sources based on the corresponding digital-step-value received from the analog-to-digital converter of the analog input device.

In Example 33, the subject matter of Example 31 may optionally include outputting, via a processor of the analog input device, a data packet including button identity (ID) and the corresponding digital-step-value of the at least one of the matrix of analog push button assemblies pressed by the user's finger;

transmitting, via a communication interface of the analog input device, the data packet from the processor of the analog input device to a host computing device;

generating, via the host computing device, a lighting signal based the corresponding digital-step-value from the data packet received from the analog input device; and sending the lighting signal to the analog input device for controlling the lighting arrangement to light the plurality of light sources based on the corresponding digital-step-value.

FIG. 1 shows a schematic diagram of an analog input device 100 according to various embodiments. According to various embodiments, the analog input device 100 may include at least one mounting panel 110. According to various embodiments, the at least one mounting panel 110 may be part of an internal support structure of the analog input device 100. According to various embodiments, the at least one mounting panel 110 may also be an internal printed circuit board (PCB) of the analog input device 100. According to various embodiments, the analog input device 100 may include a matrix of analog push button assemblies 120 mounted to the at least one mounting panel 110. According to various embodiments, the analog input device 100 may include two or more or a plurality of analog push button assemblies 120. For example, when the analog input device 100 is a mouse, the analogy input device 100 may include two or more analog click buttons. When the analog input device 100 is a keypad having 15-25 keys, the analog input device 100 may include up to 15-25 analog keys. When the analog input device 100 is a gaming controller having four or more buttons, the analog input device 100 may include two or three or four or more analog buttons. When the analog input device 100 is a keyboard, the analog input device 100 may include a plurality of analog keys.

According to various embodiments, each analog push button assembly 120 may include a pressure sensor 121 having a plunger element 122 and a pressure reception arrangement 124. The plunger element 122 may interact with the pressure reception arrangement 124 in a manner so as to exert a pressure or a force on the pressure reception arrangement 124 when the analog push button assembly 120 is being pressed by a user's finger. According to various embodiments, the pressure sensor 121 may be a swappable single unitary key-switch or may be a non-separable integrated built-in arrangement of the analog input device 100. According to various embodiments, each analog push button assembly 120 may include a button cap 123 removably coupled or fixedly coupled to the plunger element 122 of the pressure sensor 121. According to various embodiments, the button cap 123 may be a thin shell having an input surface for receiving a finger tip of the user. Accordingly, the button cap 123 may be ergonomically shaped for receiving the finger tip.

According to various embodiments, the pressure reception arrangement 124 of each analog push button assembly 120 may include an optical sensing sub-arrangement 125 configured to measure an amount of light varied according to a pressure or force sensed at the pressure reception arrangement 124. Accordingly, depressing the analog push button assembly 120 may exert a corresponding pressure or force on the pressure reception arrangement 124 which may vary the amount of light sensed by the optical sensing sub-arrangement 125. According to various embodiments, the amount of light may be varied via proportionally varying an extent of blockage of the light with a light blocking element 134 with respect to the pressure or force on the pressure reception arrangement 124. According to various embodiments, the pressure reception arrangement 124 may include an output terminal 133 for outputting an analog signal corresponding to the amount of light measured. Accordingly, the amount of light measured may be output as the analog signal. According to various embodiments, the amount of light may be an intensity of light.

According to various embodiments, the pressure reception arrangement 124 may include a biasing element 126. The biasing element 126 may be arranged between the plunger element 122 and the at least one mounting panel 110. The biasing element 126 may bias the plunger element 122 away from the at least one mounting panel 110 in a biasing direction. Accordingly, the biasing element 126 may provide resistance against the pressure or force depressing the analog push button assembly 120. According to various embodiments, the biasing element 126 may include a spring or a resilient membrane structure or other suitable elements, structures or configurations which may return the plunger element 122 to an original or initial position after being depressed. According to various embodiments, the biasing element 126 may be directly or indirectly connected in between the plunger element 122 and the at least one mounting panel 110. According to various embodiments, the pressure reception arrangement 124 may include a housing mounted to the at least one mounting panel 110 and the plunger element 122 may be slidable through a ceiling of the housing. The button cap 123 may be coupled to the plunger element 122 so as to be movable relative to the housing. The biasing element 126 may bias the plunger element 122 away from the floor of the housing in the biasing direction so as to indirectly bias the button cap 123 away from the at least one mounting panel 110.

According to various embodiments, the optical sensing sub-arrangement 125 of the pressure reception arrangement 124 may include a light emitter 130. The light emitter 130 may be disposed at an intermediate level between the plunger element 122 and the at least one mounting panel 110. The light emitter 130 may be oriented to emit light along a light path 131 perpendicular to the biasing direction of the biasing element 126. Accordingly, the light path 131 of the light emitted from the light emitter 130 may be substantially perpendicular to a direction of depression of the at least one analog push button assembly 120 by the user. According to various embodiments, the light emitter 130 may be a laser light emitter or a collimated light emitter. According to various embodiments, the intermediate level between the plunger element 122 and the at least one mounting panel 110 may be a position along a height between the mounting panel 110 and a maximum depression of the plunger element 122.

According to various embodiments, the optical sensing sub-arrangement 125 of the pressure reception arrangement 124 may include a light sensor 132. The light sensor 132 may be disposed in the light path 131 and may be configured to output an analog signal based on the amount of light sensed by the light sensor 132 for outputting via the output terminal 133. Accordingly, the light sensor 132 may be placed in a position that is directly facing the light emitter 130. Hence, the light emitter 130 and the light sensor 132 may be arranged in an opposing manner such that the light from the light emitter 130 is directly projected straight towards the light sensor 132. According to various embodiments, the light sensor 132 may detect an intensity of light incident on the light sensor 132 and output an analog signal according to the intensity of light detected. According to various embodiments, the light sensor 132 may include, but not limited to, a phototransistor-type light sensor or a photoresistor-type light sensor or a photodiode-type light sensor. According to various embodiments, the analog signal from the light sensor 132 may be an analog voltage or an analogue current.

According to various embodiments, the optical sensing sub-arrangement 125 of the pressure reception arrangement 124 may include a light blocking element 134. The light blocking element 134 may be associated with the plunger element 122 in a manner so as to be movable together with the plunger element 122 along a movement direction parallel to the biasing direction. The light blocking element 134 may be extending towards the mounting panel 110 to intersect the light path 131 between the light emitter 130 and the light sensor 132. According to various embodiments, the light blocking element 134 may be directly or indirectly coupled to the plunger element 122. According to various embodiments, the light blocking element 134 may be of an elongate shape and may be extending downwards towards the mounting panel 110. According to various embodiments, the light blocking element 134 may be positioned in a manner such that a movement path of the light blocking element 134, due to depressing of the analog push button assembly 120 by the user, may intersect the light path 131 between the light emitter 130 and the light sensor 132. According to various embodiments, when the pressure reception arrangement 124 includes the housing and the plunger element 122 is slidable through the ceiling of the housing with the button cap 123 coupled to the plunger element 122, the light blocking element 134 may be coupled to the plunger element 122 so as to be movable together with the button cap 123.

According to various embodiments, the light blocking element 134 may include a cut-out profile. FIG. 3A to FIG. 3D show various examples of the cut-out profile 136 of the light blocking element 134. The cut-out profile 136 of the light blocking element 134 may vary the amount of light passing through the light blocking element 134 as the light blocking element 134 moves transversely across the light path 131 when a pressure or force is applied to push the button cap 123 towards the at least one mounting panel 110. Accordingly, the cut-out profile 136 of the light blocking element 134 may vary the extent of blockage of the light path 131 according to the movement of the plunger element 122 as a result of the pressure or force on the pressure reception arrangement 124. According to various embodiments, the cut-out profile 136 of the light blocking element 134 may include, but not limited to, a triangular shape (see FIG. 3A), or a frusto-conical shape (see FIG. 3B), or a trumpet shape (see FIG. 3C), or arc shape (see FIG. 3D) or any other suitable shape which may vary the amount of light passing through as the light blocking element 134 moves to intersect the light path 131. According to various embodiments, the light blocking element 134 may include an elongate plate with the cut-out profile 136 and may be disposed so as to move longitudinally to intersect the light path 131 as the user applies a pressure or force to push the button cap 123.

According to various embodiments, the analog input device 100 may include a multiplexer 138 having an output side and an input side. According to various embodiments, the input side of the multiplexer 138 may be coupled to the output terminals 133 of the matrix of analog push button assemblies 120. Accordingly, the multiplexer 138 may accept multiple analog signals from the matrix of analog push button assemblies 120 and provides a single output. According to various embodiments, the analog push button assemblies 120 of the analog input device 100 may be coupled to the multiplexer 138 via a matrix connection.

According to various embodiments, the analog input device 100 may include an analog-to-digital converter (ADC) 140. The ADC 140 may be coupled to the output side of the multiplexer 138. Accordingly, the ADC 140 may receive the analog signal from the multiplexer 138 and may be configured to discretize the analog signal into a corresponding digital-step-value. According to various embodiments, the multiplexer 138 may be electrically coupled to the ADC 140 such that the analog signal output from the multiplexer 138 may be sent to the ADC 140 for converting into readable data. According to various embodiments, the ADC 140 may convert the continuous-time and continuous-amplitude analog signal from the multiplexer 138 into a discrete-time and discrete-amplitude digital-step-value. According to various embodiments, the ADC 140 may perform the conversion at a predetermined sampling interval. According to various embodiments, the total number of discrete digital-step-values for the range of analog signal from the light sensor 132 may be based on a resolution of the ADC 140. According to various embodiments, the digital-step-value may be an integer number from 0 to N, whereby N is one less than a power of two. Accordingly, each integer number of the digital-step-value may represent a corresponding magnitude of the analog signal from the light sensor 132.

According to various embodiments, the analog input device 100 may include a processor 142. The processor 142 may be coupled to the ADC 140 in a manner so as to receive the digital-step-value. The processor 142 may be configured to output a data packet including a button identity (ID) of the analog push button assembly 120 pressed by the user's finger and the digital-step-value corresponding to the analog signal from the analog push button assembly 120. According to various embodiments, the processor 142 and the ADC 140 may be in digital communication with each other. Accordingly, the digital-step-value converted by the ADC 140 may be digitally communicated to the processor 142 from the ADC 140. According to various embodiments, the processor 142 may receive various information data from the ADC 140 and/or the pressure reception arrangement 124 and/or the pressure sensor 121, and may arrange, compile and/or format the various information data, including button identity (ID) and the digital-step-value, into a string of formatted data for transmission. According to various embodiments, the string of formatted data may be in the form of a USB (Universal Serial Bus) HID (Human Interface Device) Vendor report.

According to various embodiments, the analog input device 100 may include a communication interface 144. The communication interface may be wired or wireless. The communication interface 144 may be connectable to a host computing device. The communication interface 144 may be configured to transmit the data packet from the processor 142 to the host computing device. According to various embodiments, the wired communication interface 144 may include USB connector or multi-pin electrical connectors. According to various embodiments, the wireless communication interface 144 may include infrared (IR) communication interface, radio frequency (RF) communication interface, Bluetooth communication interface, or Wi-Fi communication interface. According to various embodiments, the host computing device may be a computer or a programmable machine or programmable electronic device to which peripherals such as the input device 100 may be connected to and which directs the operation of the peripherals, including drivers for input/output devices connected to the host computing device.

According to various embodiments, the ADC 140 and the processor 142 may be separate elements of the analog input device 100. According to various embodiments, the ADC 140 and the processor 142 may be integrated as a single microcontroller 150.

Figure 2A:
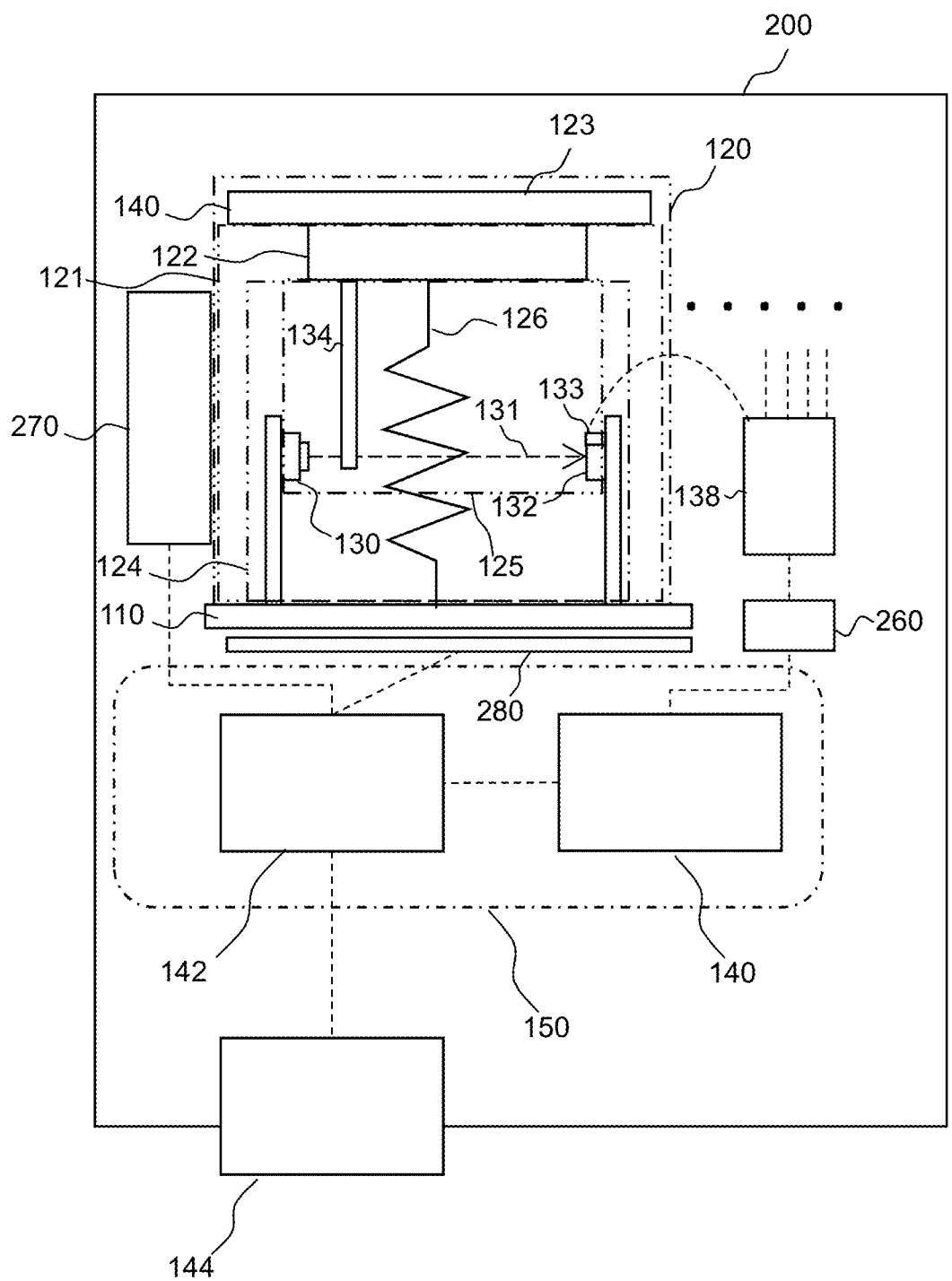
FIG. 2A and FIG. 2B show schematic diagrams of an analog input device according to various embodiments.
Figure 2B:
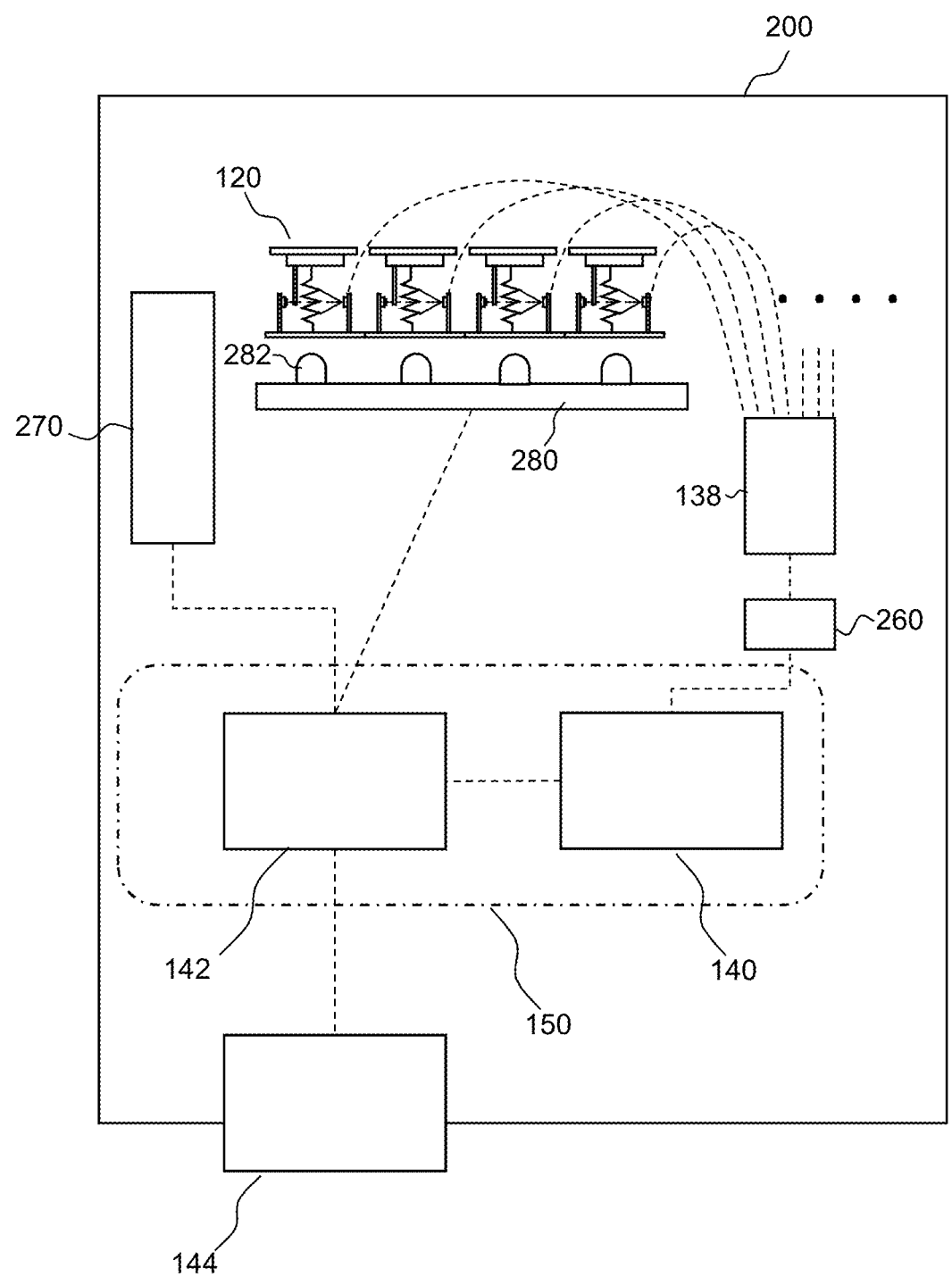

FIG. 2A and FIG. 2B show schematic diagrams of an analog input device 200 according to various embodiments. According to various embodiments, the analog input device 200 of FIG. 2A and FIG. 2B includes all the features of the analog input device 100 of FIG. 1. Accordingly, all features, changes, modifications, and variations that are applicable to the analog input device 100 of FIG. 1 may also be applicable to the analog input device 200 of FIG. 2A and FIG. 2B. According to various embodiments, the analog input device 200 of FIG. 2 may differ from the analog input device 100 of FIG. 1 in that the analog input device 200 of FIG. 2A and FIG. 2B may further include the following additional features and/or limitations.

According to various embodiments, the analog input device 200 of FIG. 2A and FIG. 2B may further include a filter 260. The filter 260 may be coupled in an electrical connection between the pressure sensor 121 and the analog-to-digital converter 140. The filter 260 may be configured to reduce noise in the analog signal from the pressure sensor 121. According to various embodiments, the filter 260 may include a low-pass filter.

According to various embodiments, the analog input device 200 of FIG. 2A and FIG. 2B may further include a storage element 270. The storage element 270 may be coupled to the processor 142 and may store instructions for execution by the processor 142. According to various embodiments, the storage element 270 may be a memory. According to various embodiments, the memory may include, but not limited to, a read-only memory (ROM), an erasable programmable read-only memory (EPROM), or a flash memory.

According to various embodiments, the analog input device 200 of FIG. 2A and FIG. 2B may further include a lighting arrangement 280 including at least one light source 282 controlled by the processor 142. According to various embodiments, the lighting arrangement 280 may include backlighting for the at least one analog push button assembly 120, and/or underglow lighting for the analog input device 200. Hence, the at least one light source 282 may serve as backlight for the at least one analog push button assembly 120 and/or may serve as underglow light for the analog input device 200.

According to various embodiments, the processor 142 may be configured to control the lighting arrangement 280 based on a lighting sequence and/or pattern stored in the storage element 270. According to various embodiments, the processor 142 may receive instructions from the host computing device which the analog input device 200 is connected to. According to various embodiments, the processor 142 may prioritise the control of the lighting arrangement 280 to be based on the instructions received from the host computing device over the lighting sequence and/or pattern stored in the storage element 270. According to various embodiments, the processor 142 may overwrite or replace the lighting sequence and/or pattern stored in the storage element 270 with a new lighting sequence and/or pattern based on instructions received from the host computing device.

According to various embodiments, the lighting arrangement 280 may include a plurality of light sources 282 respectively associated with the matrix of analog push button assemblies 120 in a manner so as to individually illuminate each of the matrix of analog push button assemblies 120. Accordingly, one light source 282 may be associated with one analog push button assembly 120. Hence, each of the matrix of analog push button assemblies 120 may be paired with a corresponding light source 282 of the lighting arrangement 280 in a manner such that each of the matrix of analog push button assemblies 120 may be independently lit by the corresponding light source 282.

Figure 2C:
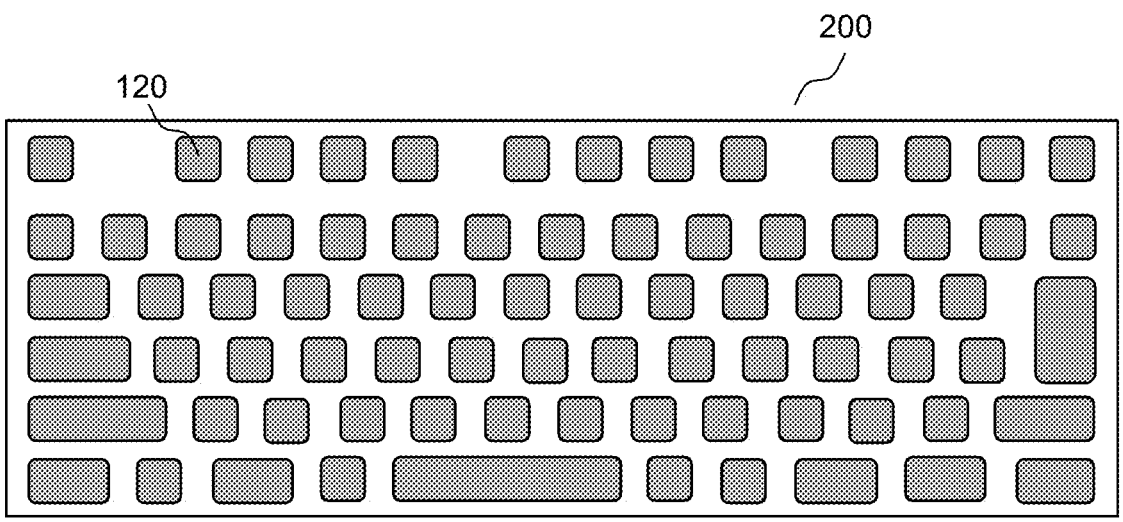
FIG. 2C to FIG. 2E show the analog input device of FIG. 2A and FIG. 2B in the form of a keyboard or a keypad being lit based on an amount of depression of a key according to various embodiments.
Figure 2D:
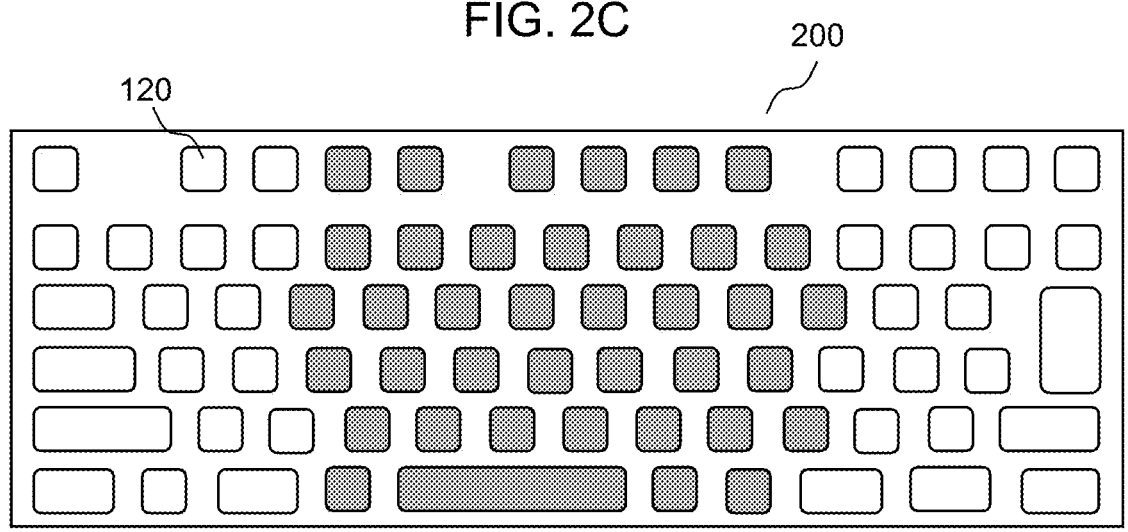
Figure 2E:
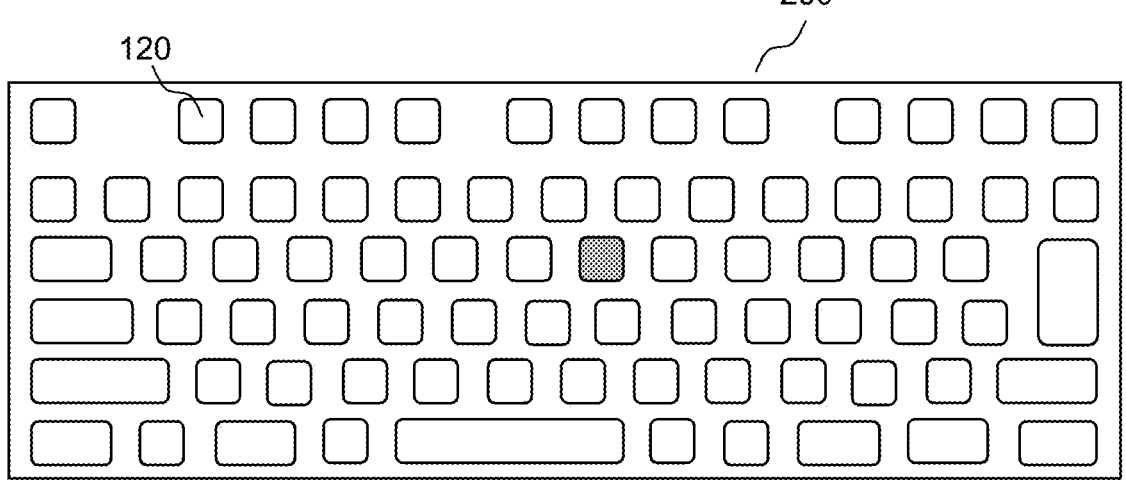
Figure 3A:
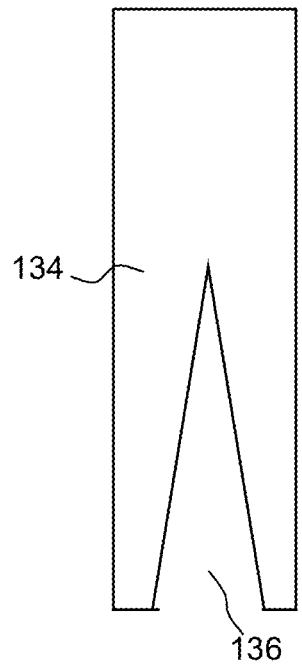
FIG. 3A to FIG. 3D show various examples of the cut-out profile of the light blocking element analog input device of FIG. 1 and FIG. 2 according to various embodiments.
Figure 3B:
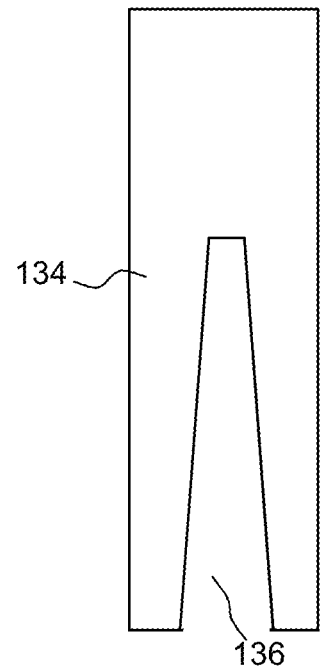
Figure 3C:
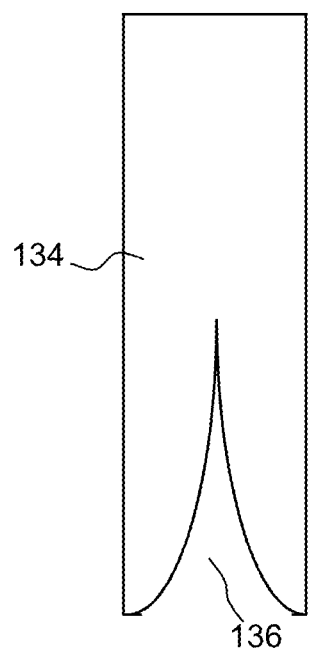
Figure 3D:
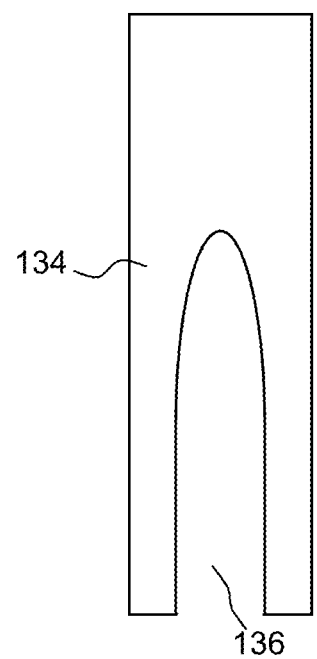

According to various embodiments, the plurality of light sources 282 of the lighting arrangement 280 may be lit based on the digital-step-value corresponding to the analog signal from the analog push button assembly 120 pressed by the user's finger such that a number of light sources 282 among the plurality of light sources 282 to be lit may be proportional to the digital-step-value. Accordingly, when one of the matrix of analog push button assemblies 120 is pressed, the lighting sequence and/or pattern of the lighting arrangement 280 may depend on the amount of depression of the one of the matrix of analog push button assemblies 120. FIG. 2C to FIG. 2E show the analog input device 200 of FIG. 2A and FIG. 2B in the form of a keyboard or a keypad being lit based on an amount of depression of a key according to various embodiments. For example, when the one of the matrix of analog push button assemblies 120 is fully depressed, all the analog push button assemblies 120 may be lit (see FIG. 2C whereby all 78 keys are lighted up). Accordingly, all the plurality of light sources 282 of the lighting arrangement 280 may be activated to light up all the analog push button assemblies 120. When the one of the matrix of analog push button assemblies 120 is depressed halfway, half of the analog push button assemblies 120 may be lit (see FIG. 2D whereby 39 out of 78 keys are lighted up). Accordingly, half of the plurality of light sources 282 of the lighting arrangement 280 may be activated to light up a half of the analog push button assemblies 120. When the one of the matrix of analog push button assemblies 120 is depressed minimally, only one of the analog push button assemblies 120 may be lit (see FIG. 2E whereby 1 out of 78 keys are lighted up). Accordingly, one of the plurality of light sources 282 of the lighting arrangement 280 may be activated to light up one of the analog push button assemblies 120.

According to various embodiments, when the plurality of light sources 282 of the lighting arrangement 280 is being lighted up based on the digital-step-value corresponding to the analog signal from the analog push button assembly 120 pressed by the user's finger, the lighting effect generated may be in a wave profile (e.g. left to right, or right to left, or top to bottom, or bottom to top, or diagonal) or ripple profile (e.g. emanating outwards from a specific key) such that the plurality of light sources 282 of the lighting arrangement 280 may be proportionally lit based on the wave profile or the ripple profile. Accordingly, the matrix of analog push button assemblies 120 may be gradually lighted up according to the wave profile or the ripple profile as the analog push button assembly 120 is pressed gradually from a minimal to the fully depressed state.

According to various embodiments, when none of the matrix of analog push button assemblies 120 is depressed, none of the analog push button assemblies 120 may be lit, or the matrix of analog push button assemblies 120 may be lit based on the lighting sequence and/or pattern stored in the storage element 270 or received from the host computing device. According to various embodiments, the processor 142 may prioritise the control of the lighting arrangement 280 to be based on the digital-step-value corresponding to the analog signal from the analog push button assembly 120 pressed by the user's finger over the instructions received from the host computing device and/or the lighting sequence and/or pattern stored in the storage element 270. Accordingly, upon depression of the analog push button assembly 120 or generation of the digital-step-value corresponding to the analog signal from the analog push button assembly 120 pressed by the user's finger, the processor 142 may interrupt any existing lighting sequence and/or pattern or unlighted state of the lighting arrangement 280 so as to control the lighting arrangement 280 for lighting up the matrix of analog push button assemblies 120 based on digital-step-value corresponding to the analog signal from the analog push button assembly 120 pressed by the user's finger.

According to various embodiments, the processor 142 may be configured to directly control the lighting arrangement 280 to light the plurality of light sources 282 based on the digital-step-value received from the ADC 140. Accordingly, the processor 142 may process the digital-step-value received from the ADC 140 and directly turn on a corresponding number of the plurality of light sources 282 based on the digital-step-value for illuminating a corresponding number of the matrix of analog push button assemblies 120.

According to various embodiments, the processor 142 may be configured to receive, via the communication interface 144, a lighting signal generated by the host computing device based on the digital-step-value in the data packet received from the analog input device 200 for controlling the lighting arrangement 280 to light the plurality of light sources 282 based on the digital-step-value. Accordingly, the host computing device may process the digital-step-value in the data packet received from the analog input device 200, generate the lighting signal based on the digital-step-value in the data packet, and send the lighting signal to the analog input device 200. The processor 142 of the analog input device 200 may receive and process the lighting signal from the host computing device and directly turn on a corresponding number of the plurality of light sources 282 based on the lighting signal for illuminating a corresponding number of the matrix of analog push button assemblies 120 based on the digital-step-value.

Figure 4:
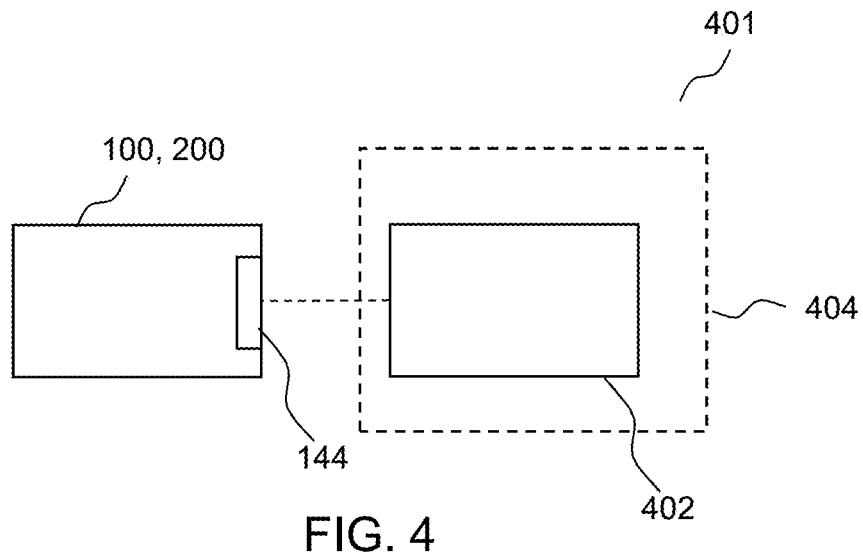
FIG. 4 shows a schematic diagram of a computing system for receiving and processing analog input according to various embodiments.

FIG. 4 shows a schematic diagram of a computing system 401 for receiving and processing analog input according to various embodiments. According to various embodiments, the computing system 401 may include a host processor 402 and the analog input device 100, 200 (of FIG. 1 and/or FIG. 2) connected to the host processor 402 via the communication interface 144. According to various embodiments, the host processor 402 may be a central processing unit of the host computing device 404. According to various embodiments, the host processor 402 may receive the data packet from the input device 100, 200. According to various embodiments, the host processor 402 may interpret the input data packet from the input device 100, 200 and execute programed instructions based on the interpreted input data packet. According to various embodiments, the host processor 402 may determine an amount of depression of the button cap 123 of a respective analog push button assembly 120 based on the digital-step-value corresponding to the analog signal from the analog push button assembly 120. According to various embodiments, the host processor 402 may determine an amount of depression of the button cap 123 of the respective analog push button assembly 120 via performing calculation or mathematical processing or mapping or table look-up operation or other suitable processing technique. According to various embodiments, the host processor 402 may generate a corresponding predetermined application event in an application program based on the determined amount of depression of the button cap 123 of the respective analog push button assembly 120 and an input setting for the application program. According to various embodiments, the corresponding predetermined application event may be a programmed action or occurrence triggered by the application program in response or recognition of the determined amount of depression of the button cap 123 of the respective analog push button assembly 120. According to various embodiments, the input setting for the application program may be a mapping of predetermined application events to the matrix of analog push button assemblies 120 and respective amount of depression. According to various embodiments, the input setting may be a pre-defined setting in the application program. According to various embodiments, the input setting may be a user definable or configurable setting which the user may alter or change in the application program accordingly based on user preference and usage.

According to various embodiments, the host processor 402 may be further configured to transform the determined amount of depression of the button cap 123 of the respective analog push button assembly 120 onto a non-linear scale prior to generating the corresponding predetermined application event. According to various embodiments, the non-linear scale may include a logarithmic scale or a variable scale. According to various embodiments, with the translation of the determined amount of depression of the button cap 123 of the respective analog push button assembly 120 onto the non-linear scale, the analog input device 100 may be configured to be more responsive in the lower or middle or higher depression range. According to various embodiments, translation to non-linear scale may allow the user to customise their own setting to suit their personal usage based on desired responsiveness of the analog input device 100.

According to various embodiments, the corresponding predetermined application event may include a continuous variable action. For example, in gaming, the continuous variable action may include a magnitude for a character's speed, directions, movements, actions etc, According to various embodiments, the host processor 402 may be configured to generate a state of the continuous variable action according to the determined amount of depression of the button cap 123 of the respective analog push button assembly 120.

According to various embodiments, the corresponding predetermined application event may include a discrete action. For example, the discrete action may be a binary action such as on or off. According to various embodiments, the host processor 402 may be configured to generate the discrete action when the determined amount of depression of the respective analog push button assembly 120 is equal to or greater than a pre-set depression level of the respective analog push button assembly 120. Accordingly, the input device may serve as a normal binary input device such as a type-writing keyboard or a numeral keypad etc. According to various embodiments, with the pre-set depression level of the button cap 123 of the respective analog push button assembly 120, an actuation point or trigger point of the respective analog push button assembly 120 may be configured or programmed. Accordingly, the respective analog push button assembly 120 may be configured or programmed to generate the discrete action at a desired amount of depression. Thus, the respective analog push button assembly 120 may trigger the discrete action without requiring full depression of the button cap 123 of the analog push button assembly 120. According to various embodiments, the pre-set depression level of the button cap 123 of the respective analog push button assembly 120 may be a user defined input. Accordingly, the host processor 402 may be configured to receive and store the user defined input as the pre-set depression level of the button cap 123 of the respective analog push button assembly 120.

According to various embodiments, the corresponding predetermined application event may include a first discrete action and a second discrete action. According to various embodiments, the host processor 402 may be configured to generate the first discrete action when the determined amount of depression of the button cap 123 of the respective analog push button assembly 120 is equal to a first pre-set depression level of the button cap 123 of the respective analog push button assembly 120 or between the first pre-set depression level of the button cap 123 of the respective analog push button assembly 120 and a second pre-set depression level of the button cap 123 of the respective analog push button assembly 120. According to various embodiments, the host processor 402 may be configured to generate the second discrete action when the determined amount of depression of the button cap 123 of the respective analog push button assembly 120 is equal to or greater than the second pre-set depression level of the button cap 123 of the respective analog push button assembly 120. Accordingly, a single analog push button assembly 120 may be configured to trigger to two or more different discrete actions by pre-setting the two or more different depression ranges for triggering the respective discrete actions. According to various embodiments, each of the first and second pre-set depression levels of the button cap 123 of the respective analog push button assembly 120 may be a respective user defined input. Accordingly, the host processor 402 may be configured to receive and store the user defined inputs as the first and second pre-set depression levels of the button cap 123 of the respective analog push button assembly 120.

According to various embodiments, the host processor 402 may be configured to toggle between a first input setting and a second input setting for the application based on a user input command via a physical modifier key or a virtual modifier key. According to various embodiments, a first corresponding predetermined application event associated with the first input setting may be different from a second corresponding predetermined application event associated with the second input setting. For example, in gaming, the first input setting may be a first mapping of fighting related predetermined application events to the matrix of analog push button assemblies 120 and the second input setting may be a second mapping of driving related predetermined application events to the matrix of analog push button assemblies 120.

According to various embodiments, the host processor 402 may be configured to generate the lighting signal based on the digital-step-value in the data packet received from the analog input device 200 and transmit the lighting signal to the analog input device 200 for controlling the lighting arrangement 280 to light the plurality of light sources 282 based on the digital-step-value. Accordingly, the host processor 402 may process the digital-step-value in the data packet received from the analog input device 200 to generate the lighting signal. The host processor 402 may then send the lighting signal to the analog input device 200 via the communication interface 144.

In the following, a gaming keypad is described as an example of the analog input device 100, 200 according to the various embodiments.

A gaming keypad combines the benefits of keyboards with the compact and ergonomic size of a controller. Typical gaming keypads contain 15-25 keys designed to be controlled by fingers of the users. These keys are laid out in a way similar to that of a keyboard's number pad, to realize various functions such as directions and navigations (up, down, left, and right), changing a weapon, jumping, or shooting. However, the keys in the conventional keypad are coupled to digital switches, which only output a binary signal, limiting the achievable functions of the keypad and possible user intents.

Example embodiments solve these problems by employing analog switches that output analog signals and a corresponding algorithm that process the signals sent from individual keys of the keypad at the host computer that is connected with the keypad wirelessly or through a USB. Analog keypads provide an enhanced input method with more granularity which gives mechanical keyboards the precision control normally found in devices such as gaming controllers, steering wheels, and aviation joysticks. By processing the signals from each key at the host computer, the latency is reduced, and a quicker response is achieved. Further, upgrading the processing solution by handling it in software offers the user flexibility in key mapping. In addition, lighting up the keypad based on the amount of depression of the individual keys may provide visual feedback or indicator to the user. Accordingly, the keypad may display the amount of depression of the individual keys through lighting effects that are proportional to the amount of depression.

Figure 5:
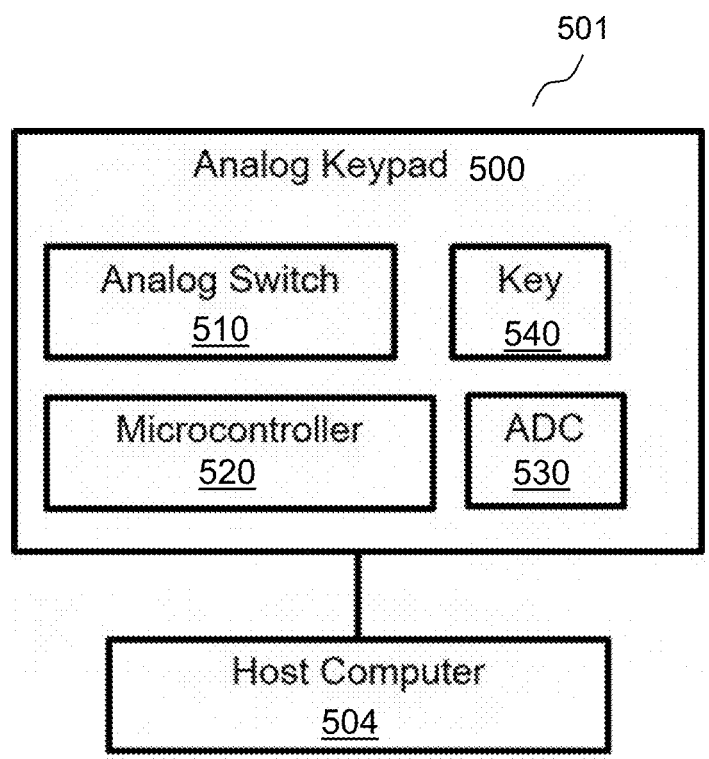
FIG. 5 shows a schematic diagram of a computing system with an analog keypad, as an analog input device, in accordance with an example embodiment.

FIG. 5 shows a computing system 501 having an analog keypad 500, as an analog input device, in accordance with an example embodiment.

By way of example, the analog keypad 500 may include a plurality of analog switches 510 (or analog pressure sensor) each disposed under a key 540, a microcontroller 520 that includes a processor and a memory, and an analog-to-digital converter (ADC) 530. The analog switches 510 may be based on opto-mechanical switch technology and output different analog signals according to the pressure or force applied to the keys or the displacement of the keys compared with the un-pressed position. The ADC 530 may convert the analog signals into digital signals and send the digital signals to the microcontroller 520 to preprocess the data. The analog keypad 500 may be connected with a host computer 504 wirelessly or through a USB. The host computer may receive the preprocessed data from the microcontroller and perform calculation to determine the pressure or force applied to one or more keys and proceed with actions to be taken.

According to various embodiments, the microcontroller 520 may control a lighting arrangement for lighting up the keys 540 of the analog keypad 500 based on the digital signals from the ADC 530. According to various embodiments, the number of keys 540 being lighted up may be proportional to the digital signals which correspond to an amount of depression of the key 540. According to various embodiments, the microcontroller 520 may directly control the lighting arrangement based on the digital signals from the ADC 530 or may control the lighting arrangement based on a lighting signal generated by the host computer 504 based on the preprocessed data received from the microcontroller 520.

Firmware may be held in the memory (or storage element) such as ROM, EPROM, or flash memory, in order to provide control for the switches and translate the analog signals sent from each analog switch to the hosting computer, such that the hosting computer may further process the signals or data to realize the corresponding functions.

In one example embodiment, when the user presses a key (or a button assembly) to a specific distance, the firmware may register this event and the event will be read by the microcontroller. Different events may be registered for difference distances the keys are pressed down. This microcontroller may constantly be monitoring the keys on the keypad via scanning, which may occur many times per second. The firmware may register when the key is pressed and to what distance the key is pressed, and rapidly perform the process of translating the keypresses from physical contact into electrical signals and then outputting them to the host computer and/or control the lighting arrangement of the input device for proportionally lighting up the input device By way of example, one analog switch (or pressure sensor) may reside underneath each key. The analog switch may include a light emitter, a chopper (or a light blocking element) disposed in the light path and a light receiver (or light sensor). The path that the lights travels along may be substantially in parallel to the surface of the keycap (or button cap). The amount of light that may be detected by the light receiver may be affected by the location of the chopper, which may be further determined by how far the key is pressed down as a function of pressure or force applied to the keycap. As the displacement of the key is proportional to the pressure or force applied, and the amount of light passing through the chopper may be related to the displacement of the key, the amount of the light detected by the light receiver may also be related to the pressure or force applied to the key. As such, the amount of light indicates the pressure or force applied on the key. For example, a spring (or a biasing element) under the key may be configured to allow a displacement of the keycap from the top end position to a bottom end position, which is proportional to the pressure or force applied to the key. The light receiver outputs analog data based on the intensity of the light detected and the analog data is further processed by the microcontroller before being sent to the host computer and/or be used to control the lighting arrangement of the input device for proportionally lighting up the input device.

In one example embodiment, when two directional keys representing x and y directions, respectively, are pressed down simultaneously, the analog switch underneath the first key may output a first analog signal having a first magnitude, and the analog switch underneath the second key may output a second analog signal having a second magnitude. The ADC converts the first and second magnitudes, which are analog signals, into digital signals based on a calibration set with a predetermined range of numbers with a minimum value and a maximum value, and sends the digital signals to the microcontroller. In one example embodiment, one or more filters filter the analog signals based on the predetermined range of numbers and send the filtered analog signals to the ADC, in order to reduce noise in one or more of the analog signals from the force sensitive keys (or pressure sensitive keys). In one example embodiment, the microcontroller may control the lighting arrangement of the input device based on the first magnitude or the second magnitude for proportionally lighting up the input device. For example, microcontroller may control the lighting arrangement of the input device based on a larger or a smaller of the first magnitude or the second magnitude.

The microcontroller may further process the digital signals sent by the ADC and converts the digital signals to codes (or format) that the host computer can understand. For example, when the analog keypad is connected with the host computer through USB, the converted code is a USB code. The conversion is usually done using a lookup table. This table is also where the keyboard layout is defined. The host computer receives the codes of each key from the analog keypad and calculates the addition of the codes, for example, and then determine the directions of the movement. The host computer may further adjust the actuation point of the switches. In addition, the host computer may change the function of the key based on the amount of pressure or force applied on the keycap.

Figure 6:
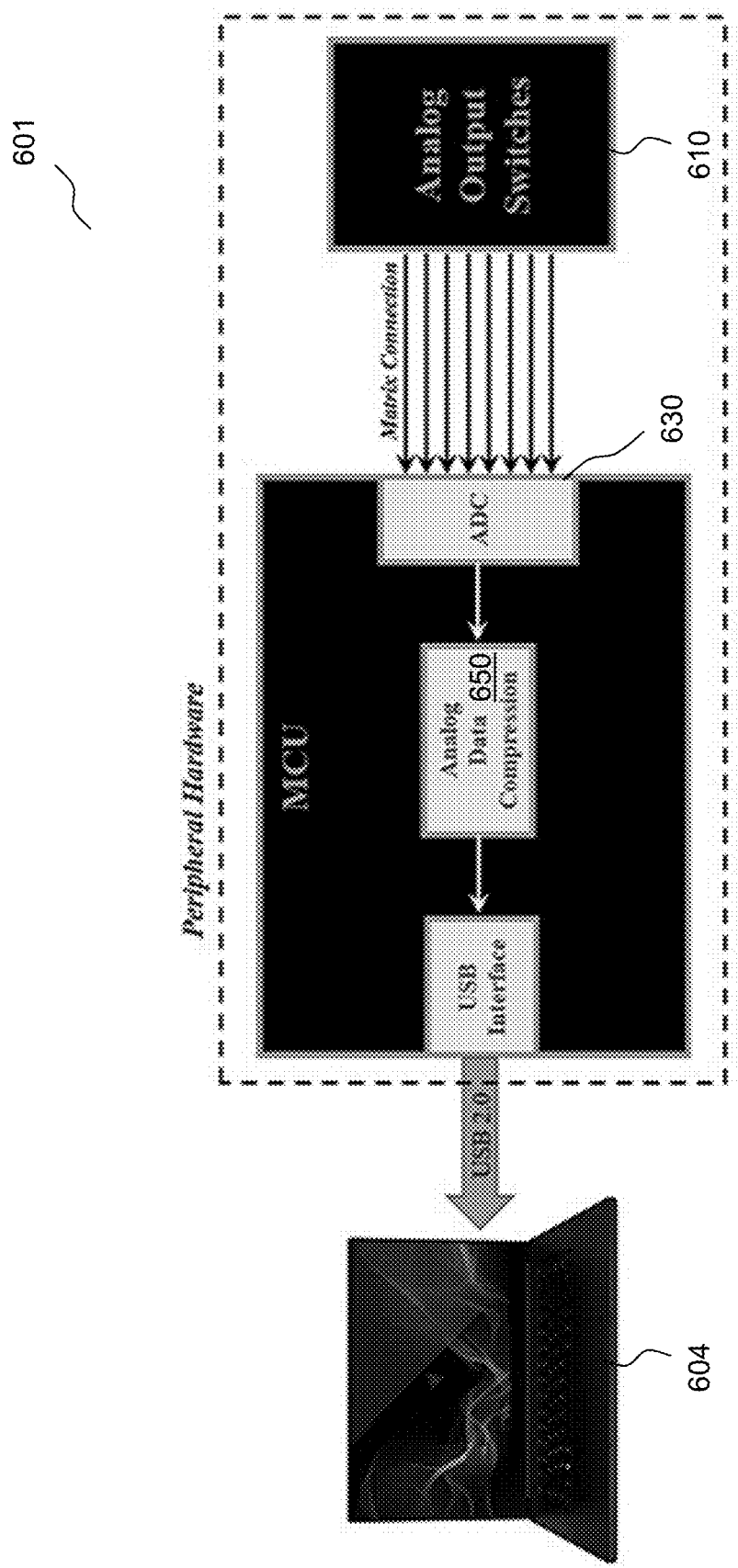
FIG. 6 and FIG. 7 show schematic diagrams of other computing systems with analog input device according to various embodiments.
Figure 7:
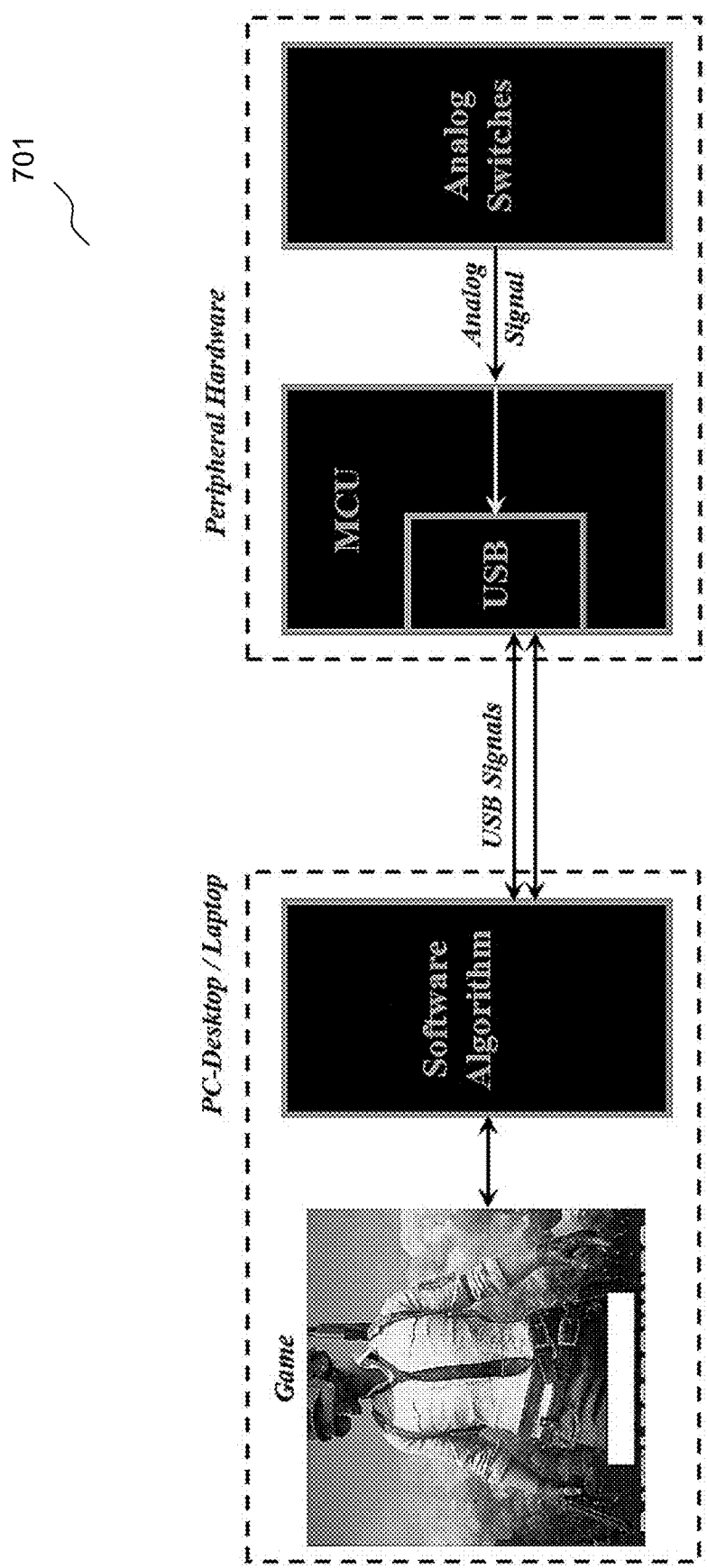

FIG. 6 and FIG. 7 show schematic diagrams of other computing systems 601, 701 with analog input device according to various embodiments. In FIG. 6, 'analog output switches' 610 represent switching hardware that can generate different signal level according to different pressure or force, 'ADC' 630 represents analog-digital-conversion module, a module which converts analog signal to digital data, and 'analog data compression' 650 is the compression of the received data into an encrypted/small packet to send back to the host CPU 604 for analog data translation. In FIG. 7, according to various embodiments, 'peripheral hardware' will only collect raw analog data, compress it and send back to the host PC through USB-Interface for data-decompression and conversion. All analog conversion for gaming applications may be done in host PC.

The above-mentioned analog keypad 500 is shown as one example embodiment of an input device. Other input devices such as mice, keyboards or controller with analog switches also apply. One or more features of the input device other than computer games may advantageously be incorporated for many other applications in translating user intent to a form interpretable by any type of computing device, including, but not limited to, personal computers, entertainment systems, industrial computing systems, stenography devices, medical computing systems, and other computing devices.

According to various embodiments, there is provided an input device for providing inputs to a computing device. The input device may include at least one input key or button. The at least one input key or button may include an input surface to receive a depressing force or pressure applied by a user. The at least one input key or button may include a switch interaction component to interact with an analog switch. The at least one input key or button may include the analog switch to receive an interaction with the interaction component, whereby the analog switch detects a property that is a function of the amount of depressing force or pressure applied by the user. The analog switch may output an analog signal.

According to various embodiments, the input device may be a keyboard having a plurality of input keys, or a keypad having a plurality of input keys, or a mouse having two or more click buttons, or a game controller having a plurality of input keys or buttons.

According to various embodiments, the input surface may be a keycap on the top surface of the key and the switch interaction component may be attached to the bottom surface of the key.

According to various embodiments, the analog switch may be located underneath the key and may interface with the switch interaction component that is attached to the bottom surface of the key.

According to various embodiments, the switch may include a light emitter, light receiver, and a chopper, whereby the light emitter may emit light in a light path substantially in parallel to the surface of the keycap which is received by the light receiver, wherein the chopper may be disposed between the light emitter and light receiver.

According to various embodiments, the interaction component may be configured to interface with the chopper to cause the chopper to move within the light path and affect the amount of light that passes through the chopper and that is received by the light receiver, and wherein the property detected by the analog switch is an amount of light received by the light receiver.

According to various embodiments, the amount of movement of the chopper within the light path may be a function of the amount of depressing force or pressure applied by the user.

According to various embodiments, the input device may include a lighting arrangement that may light up a corresponding proportion of the lighting arrangement according to the analog signal.

Various embodiments have provided an analog input device which may provide more granularity of the input in an effective and simple manner. Various embodiments have also provide an analog input device whereby the data processing will be done by the host computing device while the analog input device will just send analog data. In other words, major data crunching is performed by the host computing device while the analog input device only perform minimum pre-processing of analog signal for sending to the host computing device. Accordingly, manufacturing costs of the analog input device may be significantly reduced and the analog data processing performance may increase. Various embodiments have provided an analog input device which has re-define conventional input device. According to various embodiments, the analog input device may give more option to end user. According to various embodiments, the analog input device of the computing system may provide definable trigger point (or configurable actuation point), more than one trigger point which allows multi-functions with a single key (or multiple actuation point for multiple events with a single key/button), and/or joystick/flight stick/driving wheel/game controller functions mapping. According to various embodiments, the analog input device may provide visual feedback on the amount of depression via lighting effects of the analog input device.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

What is claimed is:

1. An analog input device comprising:
   at least one mounting panel;
   a matrix of analog push button assemblies mounted to the at least one mounting panel, each analog push button assembly comprising an analog pressure sensor, wherein the analog pressure sensor comprises:
   a pressure reception arrangement having an optical sensing sub-arrangement configured to measure an amount of light varied according to a pressure sensed at the pressure reception arrangement and an output terminal for outputting an analog signal corresponding to the amount of light measured, and
   a plunger element configured to exert the pressure on the pressure reception arrangement when the analog push button assembly is pressed by a user's finger;
   a multiplexer including an input side and an output side, wherein the input side is coupled to the output terminals of the matrix of analog push button assemblies;
   an analog-to-digital converter which is coupled to the output side of the multiplexer;
   a processor which is coupled to the analog-to-digital converter and which is configured to output a data packet including a button identity (ID) of the push button assembly pressed by the user's finger and a digital-step-value corresponding to the analog signal from the push button assembly;
   a communication interface configured to transmit the data packet to a host computing device; and
   a lighting arrangement including a plurality of light sources respectively associated with the matrix of analog push button assemblies in a manner so as to individually illuminate each of the matrix of analog push button assemblies, wherein the plurality of light sources is lit based on the digital-step-value corresponding to the analog signal from the push button assembly pressed by the user's finger such that a number of light sources among the plurality of light sources to be lit is proportional to the digital-step-value.

2. The input device as claimed in claim 1, wherein the pressure reception arrangement comprises a biasing element which is arranged between the plunger element and the at least one mounting panel and which biases the plunger element away from the at least one mounting panel in a biasing direction.

3. The input device as claimed in claim 2, wherein the optical sensing sub-arrangement comprises:
 a light emitter which is disposed at an intermediate level between the plunger element and the at least one mounting panel and which is oriented to emit light along a light path perpendicular to a biasing direction of the biasing element;
 a light sensor which is disposed in the light path and which is configured to generate the analog signal based on the amount of light sensed by the light sensor for outputting via the output terminal; and
 a light blocking element which is associated with the plunger element in a manner so as to be movable together with the plunger element along a movement direction parallel to the biasing direction and which is extending towards the mounting panel to intersect the light path between the light emitter and the light sensor, wherein the light blocking element comprises a cut-out profile which varies the amount of light passing through the light blocking element as the light blocking element moves transversely across the light path when the plunger element is moved towards the at least one mounting panel.

4. A computing system for receiving and processing analog input, the computing system comprising:
 a host processor; and
 an analog input device connected to the host processor, wherein the analog input device comprises:
  at least one mounting panel,
  a matrix of analog push button assemblies mounted to the at least one mounting panel, each analog push button assembly comprising an analog pressure sensor, wherein the analog pressure sensor comprises:
   a pressure reception arrangement having an optical sensing sub-arrangement configured to measure an amount of light varied according to a pressure sensed at the pressure reception arrangement and an output terminal for outputting an analog signal corresponding to the amount of light measured, and
   a plunger element configured to exert the pressure on the pressure reception arrangement when the analog push button assembly is pressed by a user's finger,
  a multiplexer including an input side and an output side, wherein the input side is coupled to the output terminals of the matrix of analog push button assemblies,
  an analog-to-digital converter which is coupled to the output side of the multiplexer,
  a processor which is coupled to the analog-to-digital converter and which is configured to output a data packet including a button identity (ID) of the push button assembly pressed by the user's finger and a digital-step-value corresponding to the analog signal from the push button assembly, and
  a communication interface connecting the processor of the analog input device to the host processor to transmit the data packet to the host processor,
 wherein the host processor is configured to receive the data packet from the analog input device, to determine an amount of depression of the push button assembly based on the digital-step-value corresponding to the analog signal from the push button assembly, and to generate a corresponding predetermined application event in an application based on the determined amount of depression of the push button assembly and an input setting for the application,
 wherein the analog input device further comprises a plurality of light sources respectively associated with the matrix of analog push button assemblies in a manner so as to individually illuminate each of the matrix of analog push button assemblies, wherein the plurality of light sources is lit based on the digital-step-value corresponding to the analog signal from the push button assembly pressed by the user's finger such that a number of light sources among the plurality of light sources to be lit is proportional to the digital-step-value.

5. The computing system as claimed in claim 4, wherein the host processor is further configured to transform the determined amount of depression onto a non-linear scale prior to generating the corresponding predetermined application event.

6. The computing system as claimed in claim 4,
 wherein the corresponding predetermined application event comprises a continuous variable action, and wherein the host processor is configured to generate a state of the continuous variable action according to the determined amount of depression; or
 wherein the corresponding predetermined application event comprises a discrete action, and wherein the host processor is configured to generate the discrete action when the determined amount of depression is equal to or greater than a pre-set depression level; or
 wherein the corresponding predetermined application event comprises a first discrete action and a second discrete action, and wherein the host processor is configured to generate the first discrete action when the determined amount of depression is equal to a first pre-set depression level or between the first pre-set depression level and a second pre-set depression level, and to generate the second discrete action when the determined amount of depression is equal to or greater than the second pre-set depression level.

7. The computing system as claimed in claim 4, wherein the host processor is configured to toggle between a first input setting and a second input setting for the application based on a user input command via a physical modifier key or a virtual modifier key, and wherein a first corresponding predetermined application event associated with the first input setting is different from a second corresponding predetermined application event associated with the second input setting.

8. A method of processing analog input for a computing system comprising a host processor and an analog input device connected to the host processor, wherein the analog input device comprises: at least one mounting panel; a matrix of analog push button assemblies mounted to the at least one mounting panel; a multiplexer including an input side and an output side, wherein the input side is coupled to the matrix of analog push button assemblies;

an analog-to-digital converter which is coupled to the output side of the multiplexer; a processor which is coupled to the analog-to-digital converter; and a communication interface connecting the processor of the analog input device to the host processor, the method comprising:

generating, via an optical sensing sub-arrangement of a pressure reception arrangement of an analog pressure sensor of one of the matrix of analog push button assemblies, an analog signal, corresponding to an amount of light measured as a measure of a pressure exerted on the pressure reception arrangement by a plunger element of the analog pressure sensor of the one of the matrix of analog push button assemblies when the one of the matrix of analog push button assemblies is pressed by a user's finger, based on measuring an amount of light varied according to the pressure sensed at the pressure reception arrangement;

digitizing, via the analog-to-digital converter, the analog signal into a corresponding digital-step-value;

outputting, via the processor, a data packet including button identity (ID) and the corresponding digital-step-value of the one of the matrix of analog push button assemblies pressed by the user's finger;

transmitting, via the communication interface, the data packet from the processor of the analog input device to the host processor of the computing system;

determining, via the host processor, an amount of depression of the one of the matrix of analog push button assemblies based on the corresponding digital-step-value from the data packet received;

generating, via the host processor, a corresponding predetermined application event in the application based on the determined amount of depression of the one of the matrix of analog push button assemblies and an input setting for the application; and lighting a plurality of light sources of a lighting arrangement of the analog input device associated with the matrix of analog push button assemblies of the analog input device based on the corresponding digital-step-value in a manner such that a number of light sources among the plurality of light sources of the lighting arrangement being lit is proportional to the corresponding digital-step-value, wherein the plurality of light sources of the lighting arrangement are individually illuminable.

9. The method as claimed in claim 8, further comprising transforming the determined amount of depression onto a non-linear scale prior to generating the corresponding predetermined application event.

10. The method as claimed in claim 8,
wherein the corresponding predetermined application event comprises a continuous variable action, and wherein generating the corresponding predetermined event comprises generating a state of the continuous variable action according to the determined amount of depression; or
wherein the corresponding predetermined application event comprises a discrete action, and wherein generating the corresponding predetermined event comprises generating the discrete action when the determined amount of depression is equal to or greater than a pre-set depression level; or
wherein the corresponding predetermined application event comprises a first discrete action and a second discrete action, and wherein generating the corresponding predetermined event comprises generating the first discrete action when the determined amount of depression is equal to a first pre-set depression level or between the first pre-set depression level and a second pre-set level, and to generate the second discrete action when the determined amount of depression is equal to or greater than the second pre-set depression level.

11. The method as claimed in claim 8, further comprising toggling between a first input setting and a second input setting for the application based on a user input command via a physical modifier key or a virtual modifier key, and wherein a first corresponding predetermined application event associated with the first input setting is different from a second corresponding predetermined application event associated with the second input setting.

12. The input device as claimed in claim 1, wherein the processor is configured to directly control the lighting arrangement to light the plurality of light sources based on the digital-step-value received from the analog-to-digital converter.

13. The input device as claimed in claim 1, wherein the processor is configured to receive, via the communication interface, a lighting signal generated by the host computing device based on the digital-step-value in the data packet received from the analog input device for controlling the lighting arrangement to light the plurality of light sources based on the digital-step-value.

14. The computing system as claimed in claim 4, wherein the host processor is configured to generate a lighting signal based on the digital-step-value in the data packet received from the analog input device and transmit the lighting signal to the analog input device for controlling the lighting arrangement to light the plurality of light sources based on the digital-step-value.

15. The computing system as claimed in claim 4, wherein the processor of the analog input device is configured to directly control the lighting arrangement to light the plurality of light sources based on the digital-step-value received from the analog-to-digital converter.

16. The method as claimed in claim 8, further comprising generating, via the host processor, a lighting signal based the corresponding digital-step-value from the data packet received from the analog input device and sending the lighting signal to the analog input device for controlling the lighting arrangement to light the plurality of light sources based on the corresponding digital-step-value.

17. The method as claimed in claim 8, further comprising controlling, via the processor of the analog input device, the lighting arrangement to light the plurality of light sources based on the corresponding digital-step-value received from the analog-to-digital converter of the analog input device.

* * * * *